United States Patent [19]
Endou et al.

[11] Patent Number: 5,602,508
[45] Date of Patent: Feb. 11, 1997

[54] GROUNDED-BASE TRANSISTOR AMPLIFIER

[75] Inventors: Takefumi Endou; Kazuo Watanabe, both of Gunma-ken; Mitsunari Okazaki, Fukushima-ken, all of Japan

[73] Assignees: Alps Electric Co., Ltd.; Hitachi, Ltd., both of Tokyo, Japan

[21] Appl. No.: 530,561

[22] Filed: Sep. 19, 1995

[30] Foreign Application Priority Data

Sep. 19, 1994 [JP] Japan ................................ 6-223425
Jun. 22, 1995 [JP] Japan ................................ 7-156232

[51] Int. Cl.⁶ .......................................................... H03F 3/45
[52] U.S. Cl. ........................................... 330/252; 330/261
[58] Field of Search .................................. 330/252, 254, 330/261, 301, 310, 311

[56] References Cited

U.S. PATENT DOCUMENTS 3,748,588  7/1973  Beorrier ................................ 330/254
4,374,363  2/1983  Peviti ................................ 330/311 X
5,337,010  8/1994  Nishiyama ............................ 330/255

*Primary Examiner*—Steven Mottola
*Attorney, Agent, or Firm*—Guy W. Shoup; Patrick T. Bever

[57] ABSTRACT

A grounded-base transistor amplifier including a pair of transistors which have the bases thereof grounded at a high frequency and the collectors thereof coupled to a signal output terminal, a high frequency transformer which includes a primary winding connected to a signal input terminal and a secondary winding equipped with a midpoint tap, both ends of the secondary winding being connected to the emitters of the transistors, and a constant-current circuit which is connected to the midpoint tap of the secondary winding and which produces a bias current flow through the transistors. Noise voltages generated by the constant-current circuit are supplied to the emitters of the transistors in the same phase via the secondary winding; therefore, no noise voltage appears at the signal output terminal.

9 Claims, 5 Drawing Sheets

GROUNDED-BASE TRANSISTOR AMPLIFIER

BACKGROUND OF THE INVENTION

1. Field of the Invention

The present invention relates to a grounded-base transistor amplifier and, more particularly, to a grounded-base transistor amplifier having a dramatically improved noise figure (NF).

2. Description of the Related Art

Transistor amplifiers can be roughly divided into the following three types according to the grounding mode of the amplifying transistors thereof: grounded-emitter amplifiers, grounded-base amplifiers, and grounded-collector (emitter-follower) amplifiers. These three different types of amplifiers exhibit different operating characteristics and are typically used in different applications.

FIG. 5 is a circuit configuration diagram showing an example of a grounded-emitter amplifier. More specifically, FIG. 5 shows a grounded-emitter differential transistor amplifier, which is an example of a grounded-emitter amplifier.

The grounded-emitter differential transistor amplifier shown in FIG. 5 includes differentially-connected transistors 31 and 32, collector load resistors 33 and 34, a pair of transistors 35 and 36 constituting a current mirror circuit (constant-current circuit), a constant current source 37, a signal input terminal 38, a signal output terminal 39, and an operating power supply 40.

The transistors 31 and 32, which are differentially connected, have bases thereof connected to the signal input terminal 38. The transistor 31 has a collector connected to one end of the collector load resistor 33, and the transistor 32 has a collector connected to one end of the collector load resistor 34. The collectors of both transistors 31 and 32 are also connected to the signal output terminal 39. The transistors 31 and 32 also have commonly connected emitters, which are connected to the collector of the transistor 35 of the current mirror circuit. The other end of the collector load resistor 33 and the other end of the collector load resistor 34 are commonly connected to the operating power supply 40. In the current mirror circuit, the bases of the transistors 35 and 36 are commonly connected and the collector of the transistor 36 and one end of the constant current source 37 are connected to the commonly connected bases. The emitters of the transistors 35 and 36 are grounded via resistors. The other end of the constant current source 37 is directly grounded.

In the configuration described above, whenever constant current is supplied from the constant current source 37 to the current mirror circuit, the amount of current flowing through the transistor 36 is set in accordance with the constant current. Further, the current mirror determines the amount of sink current flowing through the transistor 35. Since the collector of the transistor 35 is connected to the commonly connected emitters of the transistors 31 and 32, the sink current flowing through the transistor 35 is divided through the transistors 31 and 32, thereby causing an operating bias current to be applied to the transistors 31 and 32. In the illustrated circuit, an amplification-balanced high frequency signal supplied to the signal input terminal 38 is applied between the transistors 31 and 32 and subjected to differential amplification through the transistors 31 and 32 before it is supplied to the signal output terminal 39 and taken out as an amplified balanced high frequency signal. If an unbalanced signal is supplied to or taken out of the amplifier, then a known unbalanced-to-balanced transformer (not shown) or a balanced-to-unbalanced transformer (not shown) is typically connected to the signal input terminal 38 or the signal output terminal 39.

The noise figure (NF) of a transistor amplifier is normally related to the noise voltage which is generated by transistors or resistors used in the amplifier. More specifically, whenever currents flow through the transistors and resistors, power is consumed and a noise voltage occurs. The magnitude of the noise voltage is directly proportional to the NF of the amplifier.

In the known grounded-emitter differential transistor amplifier shown in FIG. 5, the noise voltage generated by the transistor 35 of the constant-current circuit is supplied to the emitters of the pair of transistors 31 and 32 in the same phase and output from the collectors thereof in the same phase. Hence, no noise voltage appears between the collectors.

Conventional grounded-base differential transistor amplifiers are similar to the above-described grounded-emitter differential transistor amplifiers, with the difference being that the input signals of the grounded-base amplifiers are applied to the emitters of the transistors, and that the bases of the transistors are connected to a common potential. Moreover, grounded-base differential transistor amplifiers are characterized by low input impedance, high output impedance, and good distortion characteristics in response to large inputs.

A problem with conventional grounded-base differential transistor amplifiers is the production of independent noise voltages by a constant-current circuit of the amplifier which are applied out of phase to the emitters of the amplifying transistors. These independent noise voltages are then amplified by the amplifying transistors, thereby causing the grounded-base differential transistor amplifier to exhibit a high NF.

SUMMARY OF THE INVENTION

An object of the present invention to provide a grounded-base transistor amplifier which is capable of almost completely canceling a noise voltage generated by a constant-current circuit of the amplifier, thereby achieving an extremely low noise figure (NF).

To this ends according to the present invention, a grounded-base transistor amplifier includes a pair of transistors having bases maintained at a common voltage level, emitters connected to receive differential input signals, and collectors producing amplification signals. The grounded-base transistor amplifier also includes first and second coils which are connected in series between the emitters of the paired transistors and which have almost the same inductance value, and a constant-current circuit which is connected to a node located between the first and second coils and which produces an operating bias current through the paired transistors.

According to the present invention, the noise voltage generated by the constant-current circuit is transmitted to the emitters of the paired transistors through the first and second coils. These noise voltages are applied to the emitters in-phase because the inductance values of the first and second coils are almost identical. Therefore, even if the noise voltages applied to the emitters are amplified through the pair of transistors and the noise voltages are generated at the collectors thereof, they are self-cancelling, and therefore do not appear in the output signal.

Further according to the present invention, emitter resistors are not used, thereby eliminating a source of noise due to DC currents. Hence, the noise voltage generated by an emitter resistor is not applied to the emitters of the pair of transistors and no such noise voltage appears across the collectors of the pair of transistors, thus enabling an extremely low noise figure to be achieved.

DETAILED DESCRIPTION

Comparison Examples

Figure 6:
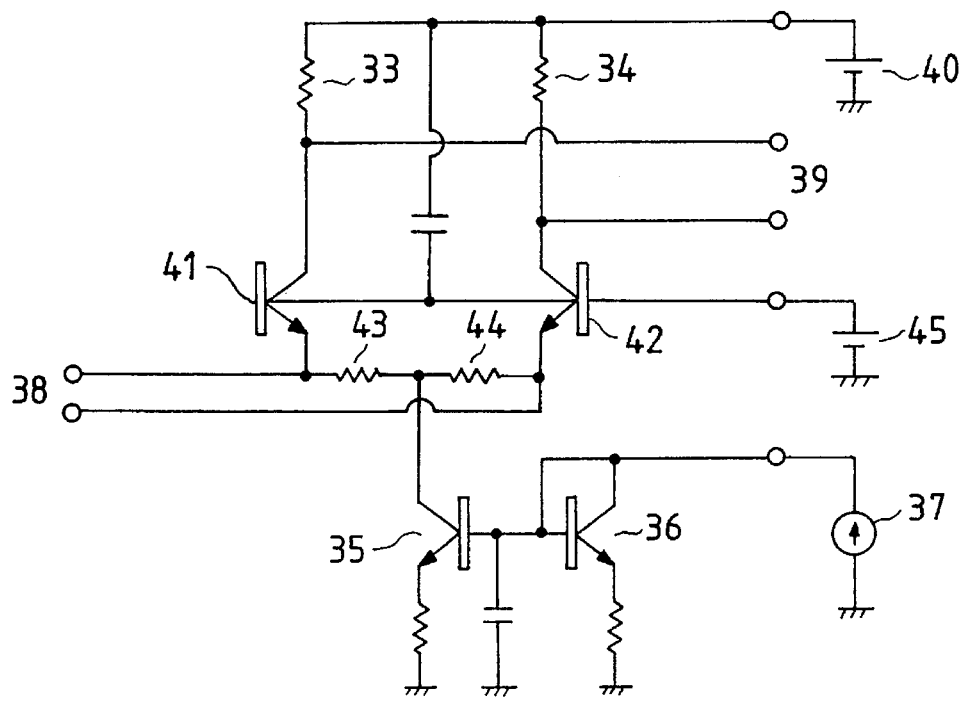
FIG. 6 is a circuit configuration diagram showing a first example of a grounded-base differential transistor amplifier provided by the present inventors for explaining the present invention.
Figure 7:
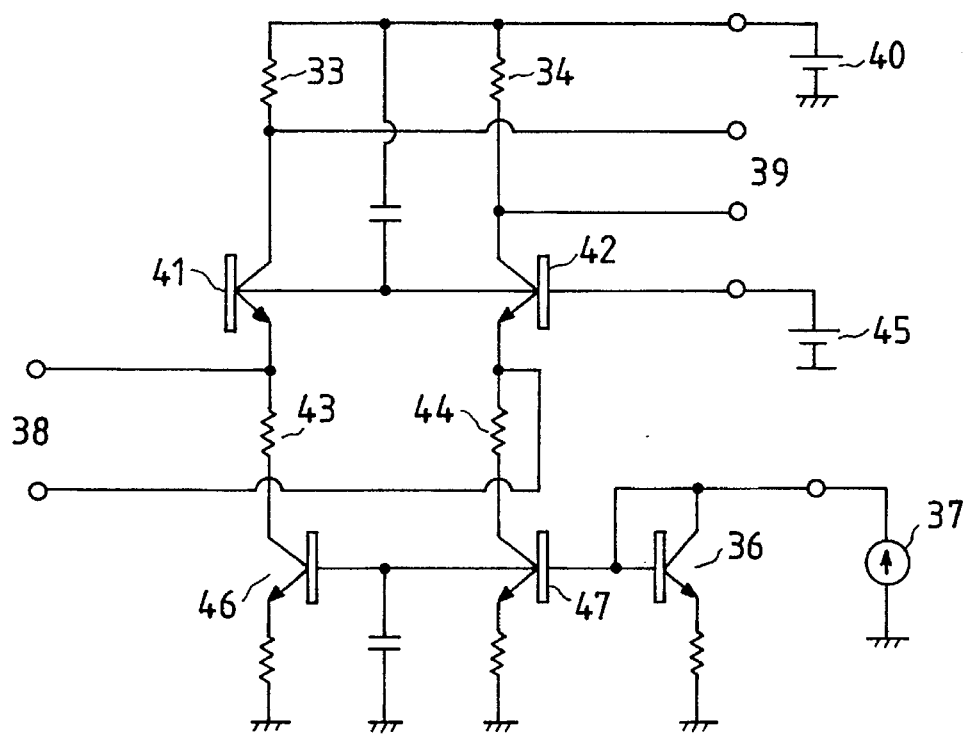
FIG. 7 is a circuit configuration diagram showing a second example of a grounded-base differential transistor amplifier provided by the present inventors for explaining the present invention.

FIGS. 6 and 7 show examples of grounded-base differential transistor amplifiers provided by the present inventors for the purpose of explaining the benefits associated with the embodiments of the present invention (described below).

Figure 5:
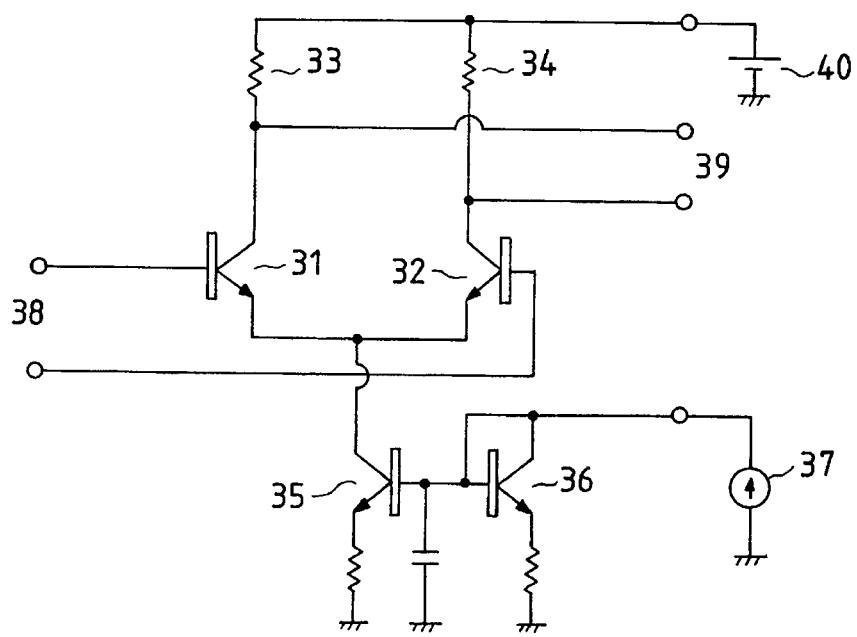
FIG. 5 is a circuit configuration diagram showing an example of the structure of a conventional grounded-emitter differential transistor amplifier.

FIG. 6 is a circuit configuration diagram of a first example of a grounded-base differential transistor amplifier which is based on the grounded-emitter differential transistor amplifier shown in FIG. 5, but which employs a common-base configuration instead of the common-emitter configuration shown in FIG. 5. The grounded-base differential transistor amplifier of FIG. 6 utilizes the low input impedance, high output impedance, and good distortion characteristics in response to large inputs which are characteristic of a grounded-base transistor amplifier.

In FIG. 6, reference numerals 41 and 42 denote a pair of transistors which are differentially connected; reference numerals 43 and 44 denote the emitter resistors of the transistors 41 and 42; and reference numeral 45 denotes a base bias power supply. Other component elements that are identical to those shown in FIG. 5 are given the same reference numerals.

Referring to FIG. 6, the emitters of the paired transistors 41 and 42 are connected to receive input signals from the signal input terminal 38, and the bases thereof are commonly connected to the base bias power supply 45. The collector of transistor 41 is connected to one end of the collector load resistor 33 and to a first terminal of the signal output terminal 39, and the collector of transistor 41 is connected to one end of the collector load resistor 34 and to a second terminal of the signal output terminal 39. The collector of transistor 35 of the current mirror circuit (constant-current circuit) is connected to the emitters of the transistors 41 and 42 via the emitter resistors 43 and 44. The rest of the configuration is the same as that of the differential amplifier shown in FIG. 5. The resistance values of the emitter resistors 43 and 44 are selected such that the current flowing through the transistor 35 is branched to flow into the transistors 41 and 42 and coupled to the emitters of the transistors 41 and 42 without attenuating the balanced signal supplied to the emitters.

The operation of the grounded-base differential transistor amplifier according to the first example is identical to that of the conventional grounded-emitter differential transistor amplifier shown in FIG. 5, which is described above, except that the signal amplification in the transistors 41 and 42 has been changed from the common-emitter amplification to the common-base amplification. Hence, the description of the operation of the grounded-base differential transistor amplifier in the first example will be omitted.

FIG. 7 is a circuit configuration diagram showing a second example of the configuration of the grounded-base transistor differential amplifier which is similar to the conventional grounded-emitter differential transistor amplifier shown in FIG. 5 except that it has common base rather than common emitter. The second example utilizes the above-mentioned good characteristics of the grounded-base transistor amplifier.

In FIG. 7, reference numeral 46 denotes a second transistor and reference numeral 47 denotes a third transistor which constitutes the current mirror circuit (constant-current circuit). Other component elements that are the same as those shown in FIG. 5 and FIG. 6 are assigned the same reference numerals.

In the second example shown in FIG. 7, the current mirror circuit is constituted by the first transistor 36 and the second and third transistors 46 and 47, the bases thereof being commonly connected together with the base of the first transistor 36. The collector of the second transistor 46 is connected to the emitter of the transistor 41 via the emitter resistor 43. Similarly, the collector of the third transistor 47 is connected to the emitter of the transistor 42 via the emitter resistor 44. The rest of the circuit configuration is the same as that of the grounded-base differential amplifier in the first example shown in FIG. 6.

The operation of the grounded-base differential transistor amplifier according to the second example shown in FIG. 7 is identical to that of the grounded-base differential transistor amplifier shown in FIG. 6 except for the configuration of the current mirror circuit. Hence, the description of the operation of the grounded-base differential transistor amplifier in the second example will be omitted.

In the grounded-base differential transistor amplifier according to the first example shown in FIG. 6, the noise voltage generated from the transistor 35 of the constant-current circuit is applied in the same phase to the emitters of the paired transistors 41 and 42. Hence, as in the case of the known grounded-emitter differential transistor amplifier shown in FIG. 5, noise corresponding to the noise voltage from the transistor 35 does not appear between the collectors. However, noise generated by the emitter resistors 43 and 44, which are connected to the paired transistors 41 and 42, does appear between the collectors of the paired transistors 41 and 42. More specifically, independent noise voltages caused by thermal noise are applied to the emitter resistors 43 and 44, respectively, which do not have an established phase and amplitude relationship. These independent noise voltages are amplified through the paired transistors 41 and 42 and, because they have independent phases and amplitudes, are not self-cancelling and appear in the output signal as noise. Accordingly, noise in the output signal cannot be prevented even when the balanced-to-balanced conversion type or balanced-to-unbalanced conversion type high-frequency transformer is connected to the signal output terminal 39.

Likewise, in the grounded-base differential transistor amplifier according to the second example illustrated in FIG. 7, it is impossible to prevent the noise voltages generated by the transistors 46 and 47 of the constant-current circuit and the noise voltages generated by the emitter resistors 43 and 44 from appearing between the collectors of the paired transistors 41 and 42. In other words, the noise voltages produced by the transistors 46 and 47 of the constant-current circuit and the noise voltages produced by the emitter resistors 43 and 44 are all independent from each other and there is no established phase relationship among the noise voltages. For this reason, the noise voltages are not self-cancelling, even if the balanced-to-unbalanced conversion type high frequency transformer is connected to the signal output terminal 39.

EMBODIMENTS OF THE PRESENT INVENTION

The embodiments of the present invention will be described in detail with reference to the accompanying drawings.

Figure 1:
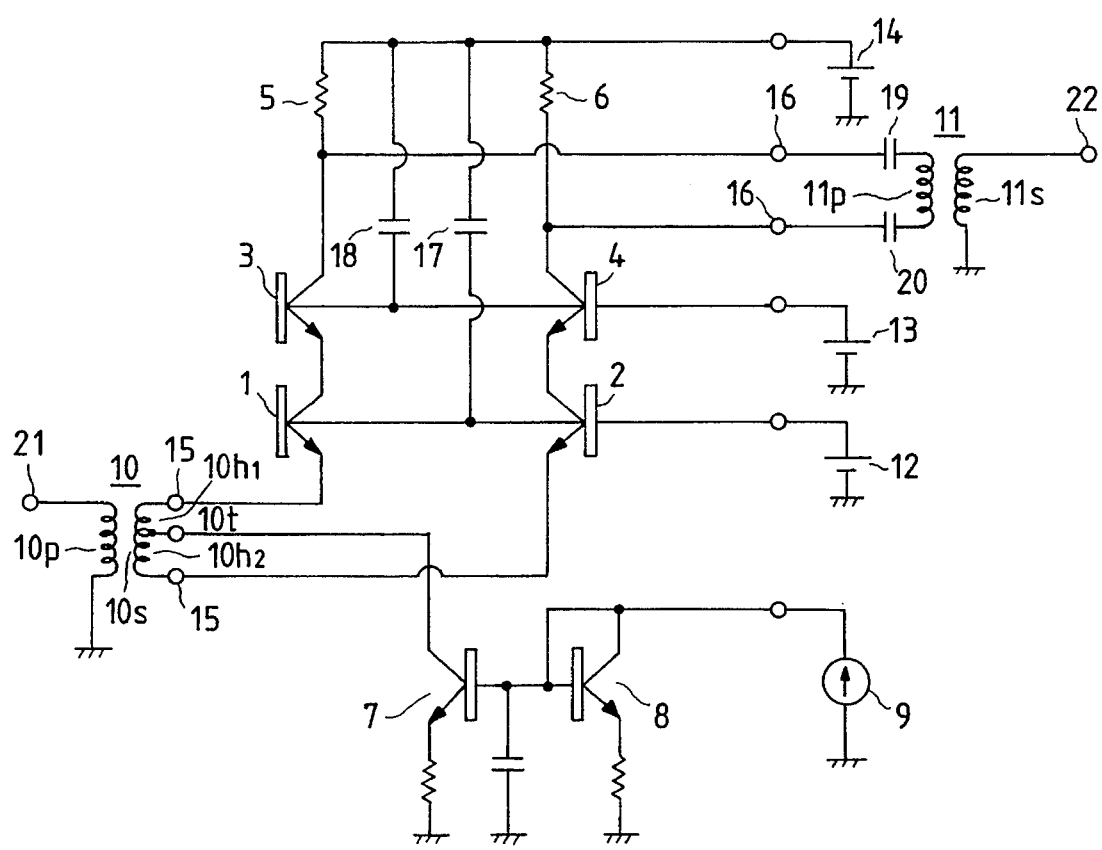
FIG. 1 is a circuit configuration diagram showing the structure of a first embodiment of a grounded-base transistor amplifier in accordance with the present invention.

FIG. 1 is the circuit configuration diagram showing the structure of the first embodiment of the grounded-base transistor amplifier in accordance with the present invention.

The grounded-base transistor amplifier shown in FIG. 1 includes a pair of amplifying transistors (first and second transistors) 1 and 2, a pair of buffer transistors 3 and 4, first and second collector load resistors 5 and 6, first and second current source transistors 7 and 8 constituting a current mirror circuit (constant-current circuit), a constant-current source 9, an input high-frequency transformer 10 connected for unbalanced-to-balanced conversion, a primary winding 10$p$, a secondary winding 10$s$ including half windings 10$h_1$ and 10$h_2$ connected at a midpoint tap 10$t$, an output high-frequency transformer 11 connected for balanced-to-unbalanced conversion, a primary winding 11$p$, a secondary winding 11$s$, first and second base bias power supplies 12 and 13, an operating power supply 14, a signal input terminal 15, a signal output terminal 16, first and second shunt capacitors 17 and 18, and first and second coupling capacitors 19 and 20.

The emitters of the amplifying transistors 1 and 2 are connected to respective ends of the signal input terminal 15. The bases of amplifying transistors 1 and 2 are commonly connected to one end of the first base bias power supply 12 and to one end of the first shunt capacitor 17. The collectors of amplifying transistors 1 and 2 are respectively connected to the emitters of the buffer transistors 3 and 4. The bases of the buffer transistors 3 and 4 are commonly connected to one end of the second base bias power supply 13 and to one end of the second shunt capacitor 18. The collector of the buffer transistor 3 is connected to one end of the first collector load resistor 5 and to one end of the first coupling capacitor 19. The collector of the transistor 4 is connected to one end of the second collector load resistor 6 and to one end of the second coupling capacitor 20. The amplifying transistors 1 and 2 are constructed of transistors having relatively large emitters, whereas the buffer transistors 3 and 4 are constructed by transistors having relatively small emitters. Commonly connected to the current mirror circuit are the bases of the first and second current source transistors 7 and 8, and connected to the commonly connected bases are the collector of the second current source transistor 8 and one end of the constant-current source 9. In the input high-frequency transformer 10, one end of the primary winding 10$p$ is connected to an unbalanced signal input terminal 21 and the other end thereof is connected to ground. Both ends of the secondary winding 10$s$ are connected to the signal input terminal 15, the midpoint tap 10$t$ thereof being connected to the collector of the first current source transistor 7 of the current mirror circuit. In the output high-frequency transformer 11, both ends of the primary winding 11$p$ are connected a second end of the first coupling capacitor 19 and to a second end of the second coupling capacitor 20; one end of the secondary winding 11$s$ is connected to an unbalanced signal output terminal 22 and the other end thereof is connected to ground. The other ends of the first and second collector resistors 5 and 6 are connected to one end of the operating power supply 14. The other end of the constant-current source 9, the other ends of the first and second base bias power supplies 12 and 13, and the other end of the operating power supply 14 are all grounded.

The following describes the operation of the grounded-base transistor amplifier of the first embodiment which has the structure stated above.

When a constant current is supplied from the constant-current source 9 to the current mirror circuit, the amount of current flowing through the second current source transistor 8 is determined in accordance with the amount of constant current, and the amount of sink current flowing through the first current source transistor 7 is also determined by the current mirror function. The sink current flowing through the first current source transistor 7 causes the currents flowing from the operating power supply 14 to the first collector resistor 5, the collector/emitter path of the buffer transistor 3, the collector/emitter path of the amplifying transistor 1, and the half winding 10$h_1$ of the secondary winding 10$s$ to flow through the midpoint tap 10$t$ of the secondary winding 10$s$ to the collector of the first current source transistor 7. Likewise, the sink current flowing through the first current source transistor 7 causes the currents flowing from the operating power supply 14 to the collector/emitter path of the buffer transistor 4, the collector/emitter path of the amplifying transistor 2, and the half winding 10$h_2$ of the secondary winding 10$s$, to flow through the midpoint tap 10$t$ of the secondary winding 10$s$ to the collector of the first current source transistor 7. This creates the operating bias current applied to the amplifying transistors 1 and 2 and the buffer transistors 3 and 4.

With such an operating bias current, when an unbalanced high-frequency signal is supplied to the unbalanced signal input terminal 21, the unbalanced high frequency signal is converted to a balanced high frequency signal through the input high-frequency transformer 10 before it is supplied to the emitters of the amplifying transistors 1 and 2 via the signal input terminal 15. Then, the balanced high-frequency signal is amplified through the transistors 1 and 2 in the grounded-base mode and led out to the collectors thereof before it is supplied to the emitters of the following buffer transistors 3 and 4. The amplified balanced high-frequency signal is further amplified through the buffer transistors 3 and 4 in the grounded-base mode and led out to the collectors thereof and supplied to the high-frequency transformer 11 via the first and second coupling capacitors 19 and 20. The amplified balanced high-frequency signal is converted back to the unbalanced high-frequency signal through the high-frequency transformer 11 before it is supplied to the unbalanced signal output terminal 22.

During such amplification of the high-frequency signal, the noise voltage generated by the first current source transistor 7 of the current mirror circuit is transmitted to the midpoint tap 10t of the secondary winding 10s of the input high-frequency transformer 10. In accordance with the present invention, a noise current based on the noise voltage of the current source transistor 7 flows through the two half windings $10h_1$ and $10h_2$ of the secondary winding 10s. The noise current flowing through the two half windings $10h_1$ and $10h_2$ causes in-phase noise voltages to appear at both ends of the secondary winding 10s of the input high-frequency transformer 10 because the number of turns of the two half windings $10h_1$ and $10h_2$ are the same and the inductance values thereof are therefore substantially the same. Hence, the noise voltage from the current source transistor 7 is applied in the same phase to the emitters of the transistors 1 and 2. The noise voltage is amplified through the transistors 1 and 2 and the buffer transistors 3 and 4 and reaches the collectors of the buffer transistors 3 and 4; however, the noise voltage appearing at the collector of the buffer transistor 3 is in the same phase as that appearing at the collector of the buffer transistor 4. Therefore, the noise voltage does not appear across the collectors thereof. Accordingly, when a balanced signal is taken out through the collectors of the buffer transistors, the noise voltage is self-canceled and does not appear in the output signal. To transmit a signal in the unbalanced mode without causing noise voltages to appear at the unbalanced signal output terminal 22, the signal should be taken out via the output high-frequency transformer 10 which is connected in the balanced-to-unbalanced conversion mode as shown in FIG. 1.

In the first embodiment, the emitters of the transistors 1 and 2 are connected to the collector of the current source transistor 7 via the secondary winding 10s of the input high-frequency transformer 10. In this case, no noise voltage is produced by DC currents because no power is consumed at the secondary winding 10s, and because no emitter resistor is connected to the emitters of the transistors 1 and 2. For this reason, the NF can be decreased in the amplified output signal using the grounded-base differential transistor of the first embodiment. This noise controlling effect cannot be obtained by the grounded-base differential transistor amplifier according to the first example shown in FIG. 6 or the second example shown in FIG. 7; only the grounded-base differential transistor amplifier of the first embodiment provides this effect.

Figure 2:
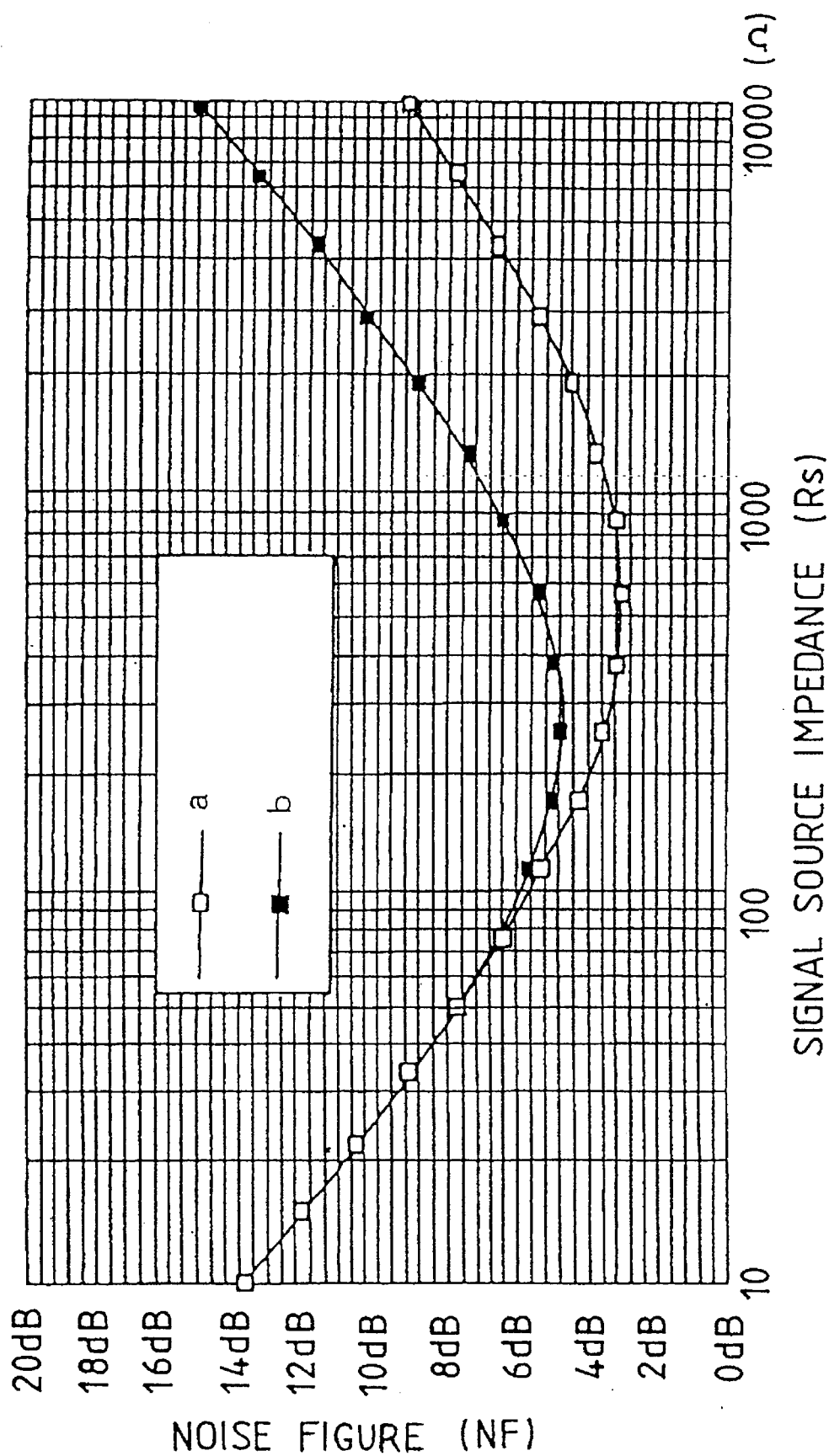
FIG. 2 is a characteristic diagram showing the noise figure (NF) in the grounded-base transistor amplifier in accordance with the embodiment.

Referring to the characteristic diagram shown in FIG. 2, the NF in the grounded-base transistor amplifier of the first embodiment is indicated by a characteristic curve a. For the purpose of comparison, the NF in the grounded-base transistor differential amplifier of the second example illustrated in FIG. 7 is indicated by a characteristic curve b.

In FIG. 2, the axis of ordinate indicates the NF and the axis of abscissa indicates signal source impedance (Rs). Curve a represents the characteristics of the grounded-base transistor amplifier of the first embodiment and curve a represents the characteristics of the grounded-base transistor differential amplifier of the second example.

It has been theoretically identified that the NF of an amplifier generally depends mainly on the signal source impedance Rs, input impedance (Zin) of an amplifier, and equivalent noise resistance (Rn) of the amplifier. The grounded-base transistor amplifier of the first embodiment should not be directly compared with the already-known grounded-emitter transistor differential amplifier illustrated in FIG. 5 or the grounded-base transistor differential amplifier of the first example shown in FIG. 6 because they differ in the input impedance (Zin), the equivalent noise resistance (Rn) and other factors.

Nevertheless, the comparison between the grounded-base transistor amplifier of the first embodiment and the grounded-base transistor differential amplifier according to the second example illustrated in FIG. 7 has revealed the following. As shown in FIG. 2, no significant improvement in the NF is observed between the grounded-base transistor amplifier of the first embodiment and the grounded-base transistor differential amplifier according to the second example when the signal source impedance (Rs) is tens of ohms ($\Omega$) or less; however, the NF in the grounded-base transistor amplifier of the first embodiment is dramatically improved over the NF in the grounded-base transistor differential amplifier according to the second example when the signal source impedance (Rs) exceeds tens of ohms ($\Omega$).

As stated previously, the amplifying transistors 1 and 2 in the first embodiment are relatively large. According to the general rule of transistors, the noise in large transistors is smaller than the noise in small transistors. Therefore, the noise in the amplifying transistors 1 and 2 is small, thus enabling the amplification with a small NF.

On the other hand, the use of the relatively large amplifying transistors 1 and 2 is accompanied by a relatively large collector parasitic capacitance composed primarily of a collector junction capacitance of the amplifying transistors 1 and 2. Connecting the collector load resistors 5 and 6 directly to the collectors of the amplifying transistors which have the large collector parasitic capacitance would result in a large time constant which depends on the collector load resistors 5 and 6 and the relatively large collector parasitic capacitance, making it difficult to achieve amplification characteristics with good high frequency characteristics.

To address this problem, the first embodiment includes the relatively small buffer transistors 3 and 4 in addition to the amplifying transistors 1 and 2. The relatively small transistors 3 and 4 provide relatively small collector capacitances accordingly. This enables the time constant, which is determined by the collector load resistors 5 and 6 and the collector parasitic capacitance, to be small. In this case, the collectors of the amplifying transistors 1 and 2 are coupled to the emitters of the buffer transistors 3 and 4, generally leading to a relatively small impedance of the emitters. This allows the amplification to be implemented with good frequency characteristics.

Thus, according to the first embodiment, the emitters of the amplifying transistors 1 and 2 receive only the noise signal from the current source transistor 7 which constitutes the constant-current circuit and the noise voltage thereof is self-canceled between the collectors of the amplifying transistors 1 and 2 and it barely appears in the output signal. As a result, the noise can be controlled to a sufficiently low level and amplification with a good high frequency characteristic can be implemented.

In the first embodiment, the buffer transistors 3 and 4 are connected to the collectors of the amplifying transistors 1 and 2. The present invention, however, is not limited to this configuration. A pair of relatively small amplifying transistors may be used. Further, when relatively small collector parasitic capacitances can be obtained or when the deterioration in frequency characteristics is allowed to a certain extent or in other similar cases, the buffer transistors 3 and 4 may possibly be omitted, and the collectors of the amplifying transistors 1 and 2 may be connected to the collector load resistors 5 and 6.

Furthermore, in the first embodiment, the balanced high-frequency signal is converted to the unbalanced high-frequency signal through the output high-frequency transformer 11 before it is transmitted from the unbalanced signal output terminal 22. The invention, however, is not limited to such configuration; a different configuration may be used wherein the output high-frequency transformer 11 is omitted and the balanced high-frequency signal is supplied to the signal output terminal 16 so that the balanced high-frequency signal may be taken out through the signal output terminal 16.

In addition, the first embodiment employs the unbalanced-to-balanced transformer for the input high frequency transformer 10 and the balanced-to-unbalanced transformer for the output high-frequency transformer 11. The invention, however, is not restricted to such a configuration; a different configuration may be used wherein the balanced-to-unbalanced transformer is used for the input high-frequency transformer 10 and/or the output high-frequency transformer 11.

A resistor of a small resistance value may be inserted as a kind of a ballast resistor between the emitters of the grounded-base transistors and the secondary winding of the input high-frequency transformer in order to make the current operating point of the grounded-base transistors stable against the variations in the base/emitter voltage and current characteristics of the transistors. Such a resistor does not need to have a large resistance value, unlike the resistors 43 and 44 shown in FIG. 6 which are required to provide relatively large resistance values. In this case, however, attention should be paid to the fact that the noise slightly increases due to these resistors, although the noise produced can be reduced to a lower level because of the smaller resistance value.

Figure 3:
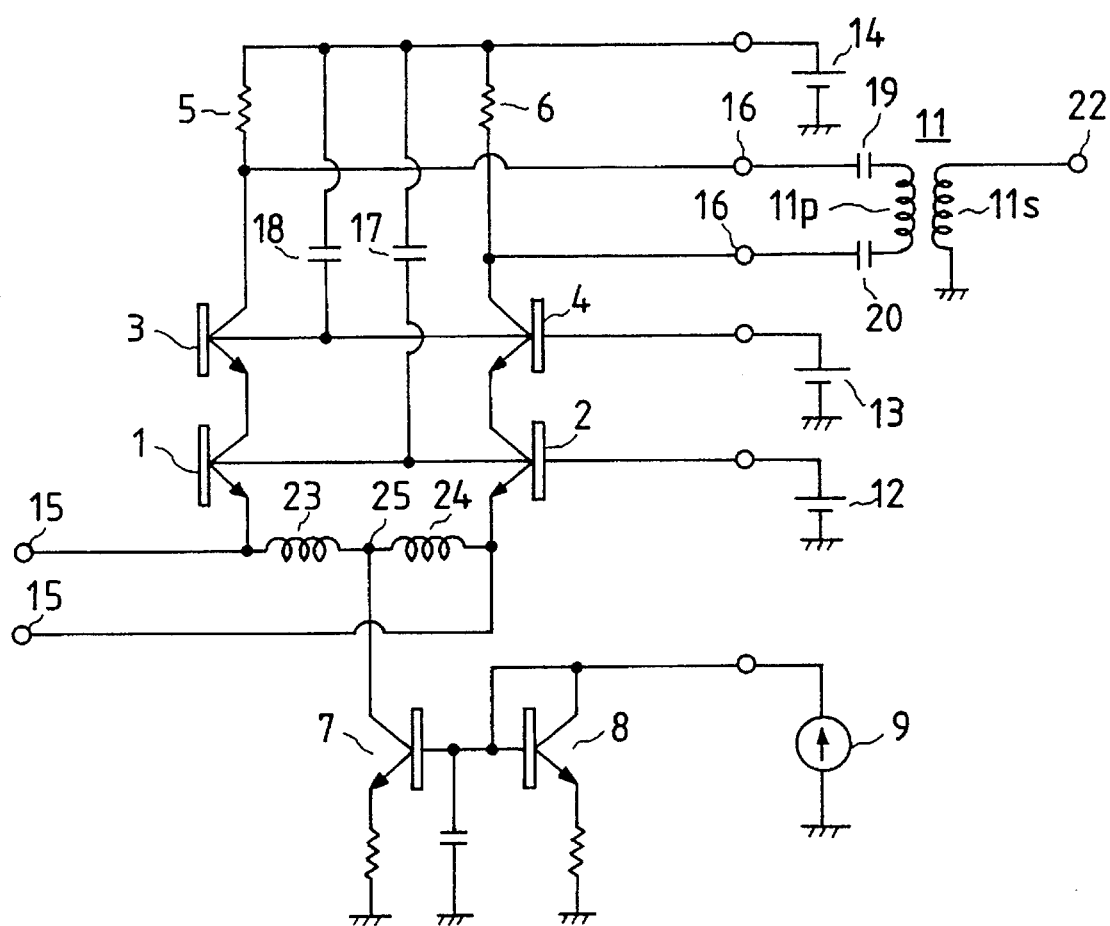
FIG. 3 is a circuit configuration diagram showing the structure of a second embodiment of a grounded-base transistor amplifier in accordance with the present invention.

FIG. 3 is a circuit configuration diagram showing the structure of the second embodiment of the grounded-base transistor amplifier in accordance with the present invention. The second embodiment employs the first and second coils in place of the input high-frequency transformer 10.

In FIG. 3, reference numeral 23 denotes the first coil, reference numeral 24 denotes the second coil which has the same inductance value as the first coil 23, and reference numeral 25 denotes the node of the first coil 23 and the second coil 24. Other component elements which are the same as those shown in FIG. 1 are assigned the same reference numerals.

The second embodiment differs from the first embodiment only in that it is equipped with the first and second coils 23 and 24, whereas the first embodiment is equipped with the input high-frequency transformer 10 which includes the secondary winding 10s having the midpoint tap 10t. There is no other structural difference between the second embodiment and the first embodiment; therefore, no further description of the structure of the second embodiment will be given.

The operation and the advantages of the second embodiment are almost the same as those of the first embodiment described above; therefore, no further description of the operation and advantages will be given. It should be noted, however, that the second embodiment provides an additional advantage in that the grounded-base differential transistor amplifier according to the second embodiment is available at a lower cost than the one according to the first embodiment because the second embodiment does not require the input high frequency transformer 10.

A single center tap type coil can replace all the first coil 23, the second coil 24, and the node 25. When such a center tape type coil is employed, the interconnection between the first coil 23 and the second coil 24 is enhanced. As a result, just like the first embodiment, the noise from the first current source transistor 7 constituting the constant-current circuit can be applied to the emitters of the grounded-base transistors 1 and 2 with better balance, enabling the noise appearing across the signal output terminals 16 and 16 to be better balanced. In other words, a better NF characteristic can be obtained by using the center tap type coil, although the coil structure is slightly more complicated.

Figure 4:
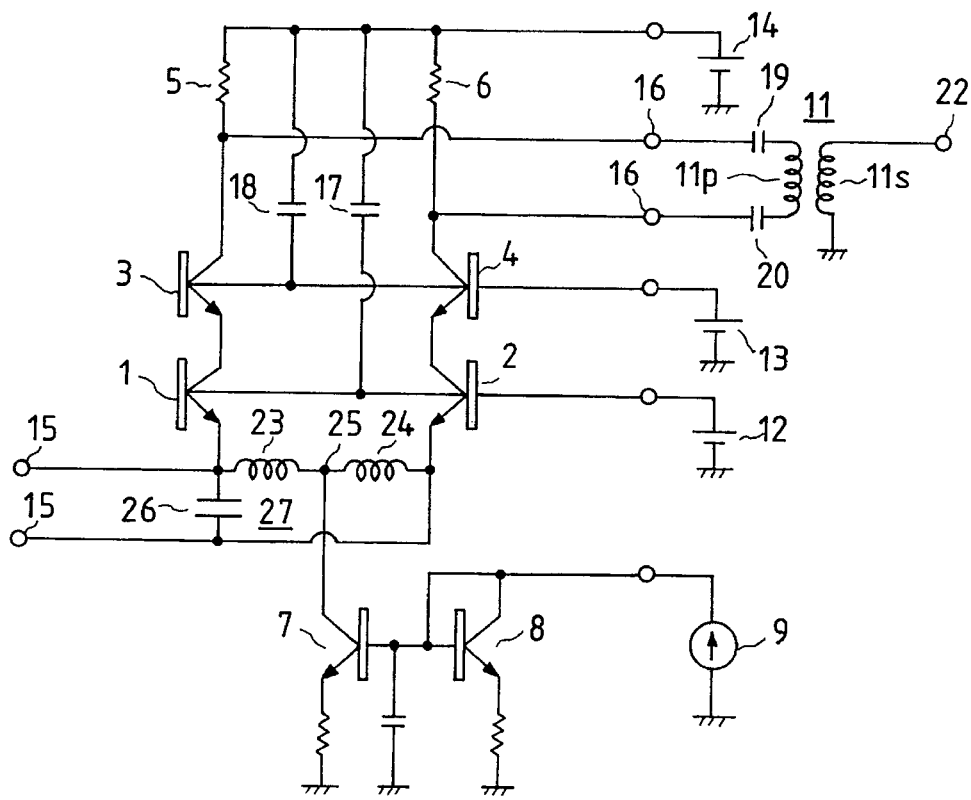
FIG. 4 is a circuit configuration diagram showing the structure of a third embodiment of a grounded-base transistor amplifier in accordance with the present invention.

FIG. 4 is a circuit configuration diagram which shows the structure of the third embodiment of the grounded-base transistor amplifier according to the present invention; it shows an example wherein a capacitor is connected in parallel to the first coil 23 and the second coil 24.

In FIG. 4, reference numeral 26 denotes a capacitor and reference numeral 27 denotes a parallel resonance circuit. The other component elements which are the same as those shown in FIG. 3 are assigned the same reference numerals.

Structurally, the third embodiment differs from the second embodiment only in that it is equipped with a parallel resonance circuit 27 constructed by the first coil 23 and the second coil 24 which are connected in series and a capacitor 26 which is connected in parallel to the above-mentioned coils. There is no other structural difference between the third embodiment and the second embodiment; therefore, no further description of the structure of the third embodiment will be given.

The operation and the advantages of the third embodiment are almost the same as those of the second embodiment described above; therefore, no further description of the operation and advantages will be given. It should be noted, however, that the third embodiment provides the following additional advantage which is not available with the second embodiment: setting the resonance frequency of the parallel resonance circuit 27 constituted by the first and second coils 23 and 24 and the capacitor 26 so that it is equivalent to the frequency of the signal applied to the emitters of the transistors 1 and 2 enables only the signal component to be applied efficiently to the emitters of the transistors 1 and 2, thereby attaining higher amplification efficiency in the transistors 1 and 2.

In this case, a balanced signal may be supplied to both ends of the parallel resonance circuit 27 or an unbalanced signal may be supplied to one end of the parallel resonance circuit 27, the other end thereof being grounded.

Thus, as described above, according to the present invention, the noise voltage generated by the current source transistor 7 constituting the constant-current circuit is applied to the emitters of the transistors 1 and 2 via the first and second coils 23 and 24, then it is amplified through the transistors 1 and 2 before it is output from the collectors thereof. The noise voltages applied to the emitters, however, have an in-phase relationship, and the noise voltages output to the respective collectors also carry the in-phase relationship; therefore, no noise voltage appears across the collectors of the transistors 1 and 2. Hence, there is an advantage in that a grounded-base differential transistor amplifier with a dramatically decreased NF can be achieved.

Further according to the present invention, since there is no emitter resistor through which DC currents flow into the emitters of the transistors 1 and 2, the noise voltage generated by such an emitter resistor is not applied to the emitters of the transistors 1 and 2. This aspect also leads to an advantage in that a grounded-base differential transistor amplifier with a significantly decreased NF can be achieved.

In this case, providing the emitters of the transistors 1 and 2 with the first and second coils 23 and 24 connected in series eliminates the need for the expensive unbalanced-to-balanced conversion type high frequency transformer 10. This provides an additional advantage in that an inexpensive grounded-base transistor amplifier can be achieved. As another additional advantage, efficient amplification is ensured by reducing unnecessary signals so that only a required signal may be applied to the respective emitters of the transistors 1 and 2.

What is claimed is:

1. A grounded-base transistor amplifier comprising:

first and second transistors having bases connected to a common potential, emitters and collectors;

a first coil and a second coil connected in series between the emitters of the first and second transistors, the first and second coils having substantially identical inductance values; and a constant-current circuit connected to a node located between the first and second coils, the constant-current circuit producing an operating bias current through the first and second transistors.

2. A grounded-base transistor amplifier according to claim 1, wherein the first and second coils are portions of a secondary winding of a high-frequency transformer, the node is a center tap of the secondary winding, the constant-current circuit is connected to the midpoint tap, and a signal supplied to a primary winding of the high-frequency transformer is applied to the emitters of the first and second transistors through the secondary winding.

3. A grounded-base transistor amplifier according to claim 2, wherein the primary winding of the high-frequency transformer includes a first terminal connected to receive an unbalanced signal, and a second terminal connected to ground.

4. A grounded-base transistor amplifier according to claim 1, wherein a capacitor is connected in parallel with the first and second coils, and the first and second coils and the capacitor constitute a parallel resonance circuit.

5. A grounded-base transistor amplifier according to claim 4, wherein the parallel resonance circuit is configured to include a resonance frequency which nearly coincides with a frequency of the signal.

6. A grounded-base transistor amplifier according to claim 4, wherein the parallel resonance circuit is configured to include a resonance frequency which nearly coincides with a frequency of the signal.

7. A grounded-base transistor amplifier according to claim 1, further comprising first and second buffer transistors having emitters respectively connected to the collectors of the first and second transistors, and bases connected to a second voltage potential, wherein output signals are transmitted through collectors of the first and second buffer transistors.

8. A grounded-base transistor amplifier according to claim 7, wherein balanced signals are issued through the collectors of the first and second buffer transistors.

9. A grounded-base transistor amplifier according to claim 8, wherein the first and second buffer transistors transmit the output signals via a balanced-to-unbalanced conversion type high-frequency transformer.

* * * * *